(12) United States Patent
Classen

(10) Patent No.: US 8,689,633 B2
(45) Date of Patent: Apr. 8, 2014

(54) MICROMECHANICAL SYSTEM

(75) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 560 days.

(21) Appl. No.: 12/806,311

(22) Filed: Aug. 9, 2010

(65) Prior Publication Data
US 2011/0056295 A1 Mar. 10, 2011

(30) Foreign Application Priority Data

Sep. 4, 2009 (DE) .......................... 10 2009 029 202

(51) Int. Cl.
*G01P 15/125* (2006.01)
(52) U.S. Cl.
USPC ......................................... 73/514.32; 73/510
(58) Field of Classification Search
USPC ............ 73/514.32, 510, 511, 514.36, 514.38, 73/514.29
See application file for complete search history.

(56) References Cited

U.S. PATENT DOCUMENTS

| | | | |
|---|---|---|---|
| 6,845,670 B1 * | 1/2005 | McNeil et al. | 73/514.32 |
| 7,322,240 B2 * | 1/2008 | Robert | 73/514.32 |
| 7,487,661 B2 * | 2/2009 | Ueda et al. | 73/1.39 |
| 7,690,255 B2 * | 4/2010 | Gogoi et al. | 73/514.32 |
| 7,858,440 B2 * | 12/2010 | Pressel et al. | 438/109 |
| 8,020,443 B2 * | 9/2011 | Lin et al. | 73/514.32 |
| 8,047,075 B2 * | 11/2011 | Nasiri et al. | 73/514.32 |
| 8,186,221 B2 * | 5/2012 | Lin et al. | 73/514.32 |
| 2004/0079154 A1 * | 4/2004 | Yoshikawa et al. | 73/514.32 |
| 2009/0152654 A1 * | 6/2009 | Classen et al. | 257/415 |
| 2010/0024554 A1 * | 2/2010 | Classen et al. | 73/514.32 |
| 2010/0043549 A1 * | 2/2010 | Classen et al. | 73/510 |

FOREIGN PATENT DOCUMENTS

| | | |
|---|---|---|
| DE | 100 64 494 | 7/2002 |
| DE | 10 2006 032 195 | 1/2008 |
| DE | 10 2007 060 878 | 6/2009 |

* cited by examiner

*Primary Examiner* — Helen Kwok
(74) *Attorney, Agent, or Firm* — Kenyon & Kenyon LLP

(57) ABSTRACT

A micromechanical system includes a first movable element, which is connected to a substrate via a first spring element, and a second movable element, which is connected to the substrate via a second spring element. The first movable element and the second movable element are movable in relation to the substrate independent of one another. Furthermore, the first movable element and the second movable element are situated one above the other in at least some sections in a direction perpendicular to the substrate surface.

5 Claims, 13 Drawing Sheets

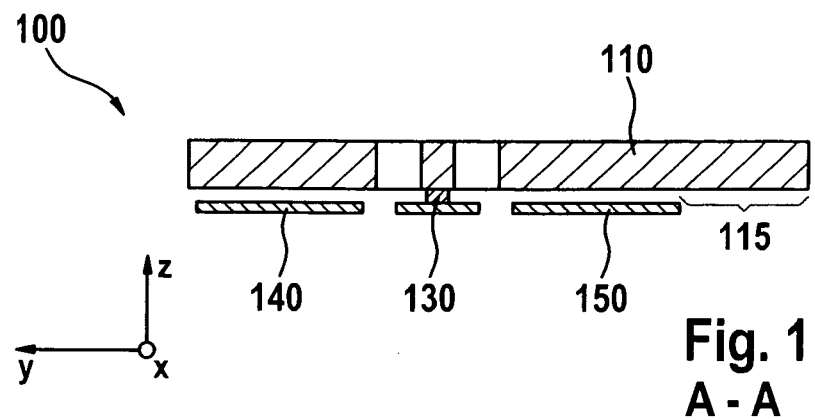
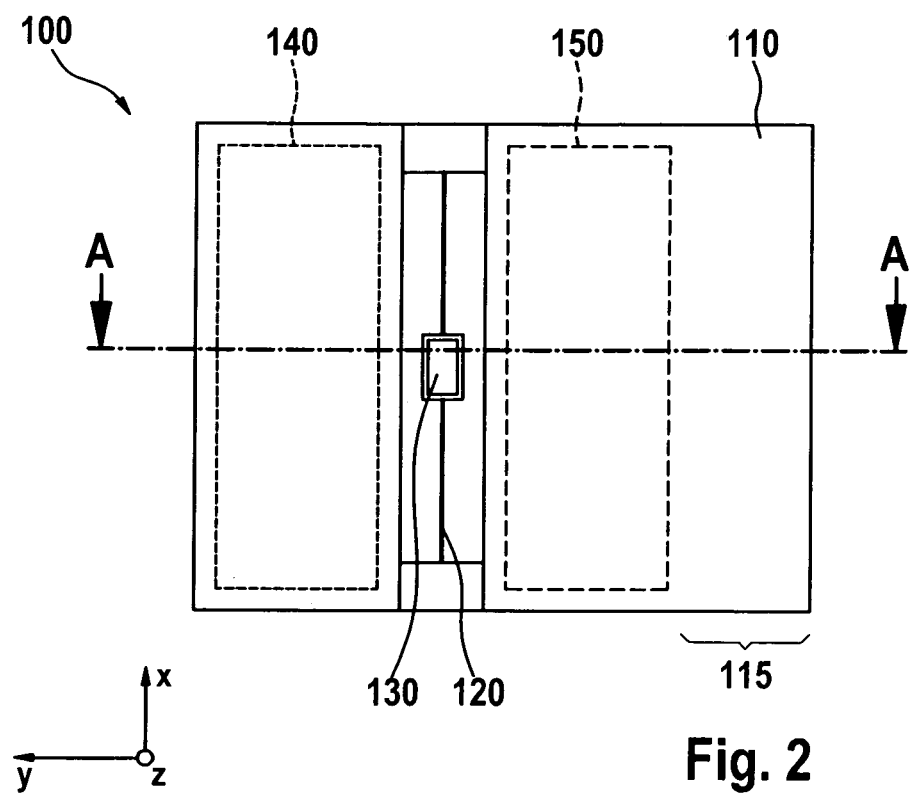

B - B

C - C

D - D

E - E

F - F

G - G

H - H

I - I

J - J

K-K

MICROMECHANICAL SYSTEM

BACKGROUND OF THE INVENTION

1. Field of the Invention

The present invention relates to a micromechanical system and a method for manufacturing a micromechanical system.

2. Description of Related Art

Micromechanical systems are used as sensors and actuators in the automotive field and in consumer entertainment electronics and are typically produced by using surface micromechanical methods. Conductive function layers and insulating sacrificial layers, often containing polycrystalline silicon and oxides, are deposited on a substrate wafer. Movable micromechanical elements are fabricated from a function layer and are exposed mechanically by dissolving away the sacrificial layer underneath.

Multichannel sensors, which are suitable for detection of measured variables, for example, accelerations in multiple directions in space, are implemented by single-channel sensors situated side-by-side on a substrate according to the related art. This is described in published German patent document DE 100 64 494 A1, for example. This side-by-side layout requires a great deal of space. Alternatively, it has been proposed that a multichannel sensor having a single seismic mass movable in multiple directions in space be designed. This embodiment has the disadvantage that it results in increased crosstalk between the individual channels.

It has also been proposed that micromechanical sensors be fabricated from substrates having more than one function layer. Published German patent application document DE 10 2007 060 878 A1 describes a single-channel micromechanical sensor element fabricated from a substrate having a conductor path layer and two functional layers. Published German patent application document DE 10 2006 032 195 A1 describes a corresponding manufacturing method.

BRIEF SUMMARY OF THE INVENTION

An object of the present invention is to provide a compact micromechanical system having at least two elements, which are movable independent of one another and are situated one above the other in at least some sections. Another object of the present invention is to provide a method for manufacturing such a micromechanical system.

A micromechanical system according to the present invention includes a first movable element, which is connected to the substrate by a first spring element, and a second movable element, which is connected to the substrate by a second spring element. The first movable element and the second movable element are movable in relation to the substrate independent of one another. Furthermore, the first movable element and the second movable element lie one above the other in a direction perpendicular to the substrate surface in at least some sections. This micromechanical system advantageously has two measurement channels, which operate independent of one another and have a low mutual influence. The vertical placement above one another allows a space-saving and inexpensive embodiment.

The first movable element and the second movable element are preferably electrically insulated from one another. The movable elements may then advantageously be set at different electrical potentials, so there is a great freedom in the choice of an optimal electrical evaluation principle.

In one refinement, the micromechanical system has a third movable element, which is connected to the substrate via a third spring element. The third movable element is movable in relation to the substrate independent of the first movable element and independent of the second movable element. Furthermore, the second movable element and the third movable element lie one above the other in a direction perpendicular to the substrate surface in at least some sections. Three sensor channels independent of one another may therefore be implemented to advantage without significantly increasing the space required for the micromechanical system.

A method according to the present invention for manufacturing a micromechanical system having a first movable element, which is connected to a substrate via a first spring element, and a second movable element, which is connected to the substrate via a second spring element, the first movable element and the second movable element being movable in relation to the substrate independent of one another, includes method steps for: depositing and structuring a second insulation layer; depositing a second conductive layer and structuring a movable element in the second conductive layer; depositing and structuring a third insulation layer; depositing a third conductive layer and structuring a second movable element in the third conductive layer, at least one section of the second movable element being situated above the first movable element in a direction perpendicular to the surface of the substrate; and removing the second insulation layer beneath the first movable element and the third insulation layer beneath the second movable element. This method advantageously allows micromechanical sensors having multiple independent sensor channels and a reduced space requirement to be manufactured. Furthermore, the individual sensor structures may be placed and wired in a highly flexible manner.

In a refinement of the method, after depositing and structuring the third conductive layer, steps are performed for depositing and structuring a fourth insulation layer and for depositing a fourth conductive layer and for structuring a third movable element in the fourth conductive layer, at least a section of the third movable element being situated above the second movable element in a direction perpendicular to the surface of the substrate, and then the fourth insulation layer beneath the third movable element is removed. With this method, it is advantageously possible to integrate a third independent sensor channel into the micromechanical system without significantly increasing the space required.

Before depositing and structuring the second insulation layer, method steps are preferably performed for depositing and structuring a first insulation layer on the substrate and for depositing and structuring a first conductive layer. The first conductive layer may then advantageously be used for manufacturing fixed electrodes and conductor paths.

BRIEF DESCRIPTION OF THE DRAWINGS

FIG. 1 shows a section through a first z-sensor.
FIG. 2 shows a top view of the z-sensor.

DETAILED DESCRIPTION OF THE INVENTION

Figure 3:
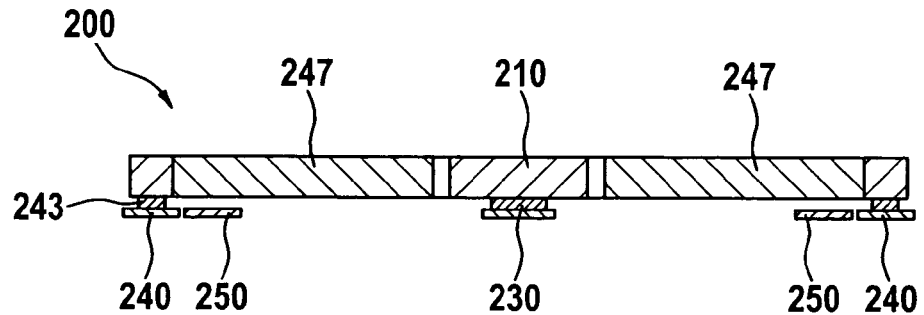
FIG. 3 shows a section through a first x-sensor.

FIG. 1 shows a section through a z-sensor 100 parallel to a y-z layer, the sensor being situated above a substrate (not shown in FIG. 1) in an x-y layer. FIG. 2 shows a top view of z-sensor 100. z-sensor 100 is provided for detection of accelerations acting in the z-direction. z-sensor 100 includes a rocker mass 110 situated in an x-y layer. Rocker mass 110 is connected to a substrate connection 130, which is rigidly connected to the substrate, lying beneath rocker mass 110 in the z-direction. Substrate connection 130 and torsion spring 120 may also function as a feeder line via which rocker mass 110 may be set at a desired electrical potential. Rocker mass 110 may be rotated about torsion spring 120. Rocker mass 110 is designed asymmetrically with respect to torsion spring 120. The section of rocker mass 110 situated on one side of torsion spring 120 has an extra mass 115 opposite the section of rocker mass 110 situated on the other side of torsion spring 120. A right conductor path electrode 150 is situated beneath the section of rocker mass 110 provided with extra mass 115. A left conductor path electrode 140 is situated beneath the other section of rocker mass 110. Left conductor path electrode 140 and right conductor path electrode 150 may be fixedly connected to the substrate, each forming a capacitor having rocker mass 110. Due to extra mass 115, an acceleration acting on z-sensor 100 in the z-direction results in tilting of rocker mass 110 about the axis of rotation formed by torsion spring 120, so the distances between rocker mass 110 and left conductor path electrode 140 and right conductor path electrode 150 are modified. The resulting changes in capacitance of the capacitors formed by rocker mass 110 and left conductor path electrode 140 and/or right conductor path 150 constitute a measure of the magnitude of the acceleration acting in the z-direction and may be detected by an electrical evaluation circuit.

Figure 4:
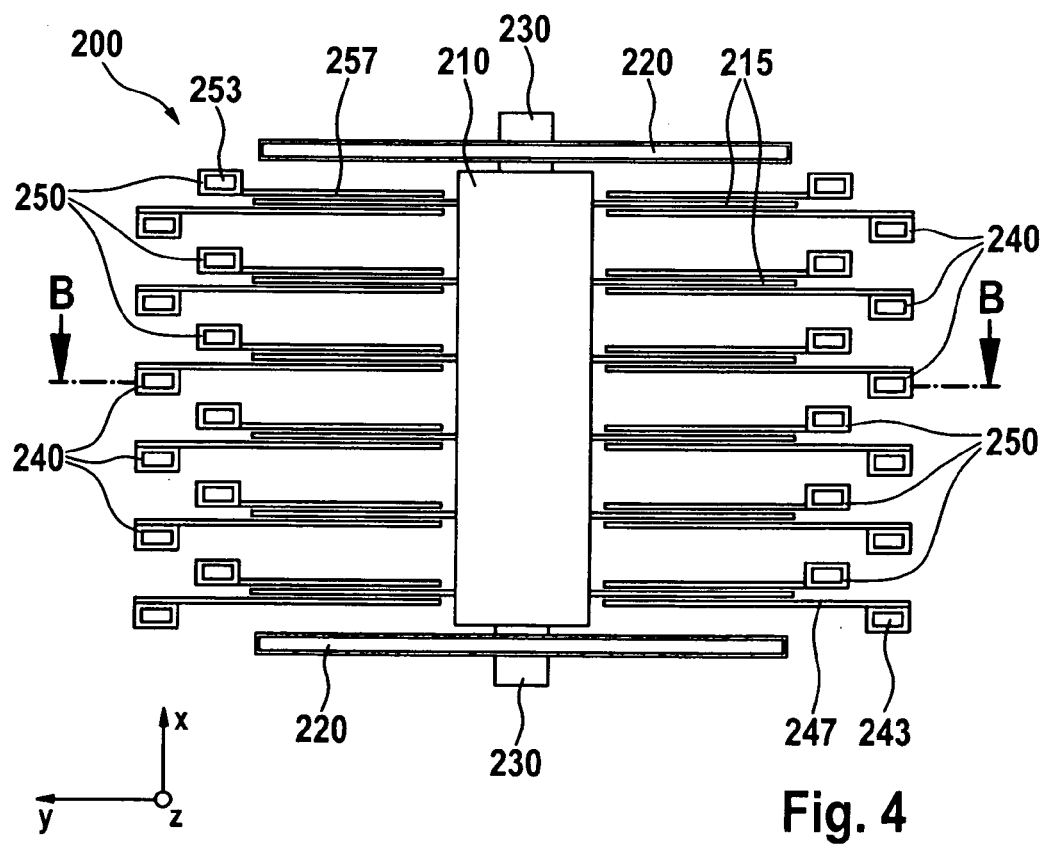
FIG. 4 shows a top view of the x-sensor.

FIG. 3 shows a section through an x-sensor 200 parallel to a y-z layer, the section being situated above a substrate (not shown in FIG. 3) in an x-y layer. FIG. 4 shows a top view of x-sensor 200. x-sensor 200 is provided for detection of an acceleration acting in the x-direction. x-sensor 200 has a seismic mass 210, which is movable in relation to the substrate in the x-direction. Seismic mass 210 is connected to two substrate connections 230 via two spiral springs 220, the substrate connections being rigidly connected to the substrate. Substrate connections 230 and spiral springs 220 may also function as feeder lines via which seismic mass 210 may be set at a desired electrical potential. Seismic mass 210 has a plurality of mass fingers 215 pointing in the positive and negative y-directions. In addition, a plurality of first counter-electrodes 240 and second counter-electrodes 250 is provided. Each first counter-electrode has a first substrate connection 243 and a first electrode finger 247. Each second counter-electrode 250 has a second substrate connection 253 and a second electrode finger 257. Substrate connections 243, 253 also function as feeder lines. First electrode fingers 247 and second electrode fingers 257 are each oriented in the y-direction. One mass finger 215 is situated between a first electrode finger 247 and a second electrode finger 257. First electrode fingers 247 together with mass fingers 215 form a first capacitor, whose capacitance is a function of the distance of mass fingers 215 from first electrode fingers 247. Second electrode fingers 257 together with mass fingers 215 form a second capacitor, whose capacitance is a function of the distance of second electrode fingers 257 from mass fingers 215. An acceleration acting on x-sensor 200 in the x-direction results in a deflection of seismic mass 210 in the x-direction toward spiral spring 220, so distances between mass fingers 215 and first electrode fingers 247 and second electrode fingers 257 are modified. The resulting changes in capacitances of the two capacitors formed by electrode fingers 247, 257 and mass fingers 215 represent a measure of the magnitude of the acceleration acting on x-sensor 200 and may be detected by an electronic evaluation unit.

Figure 5:
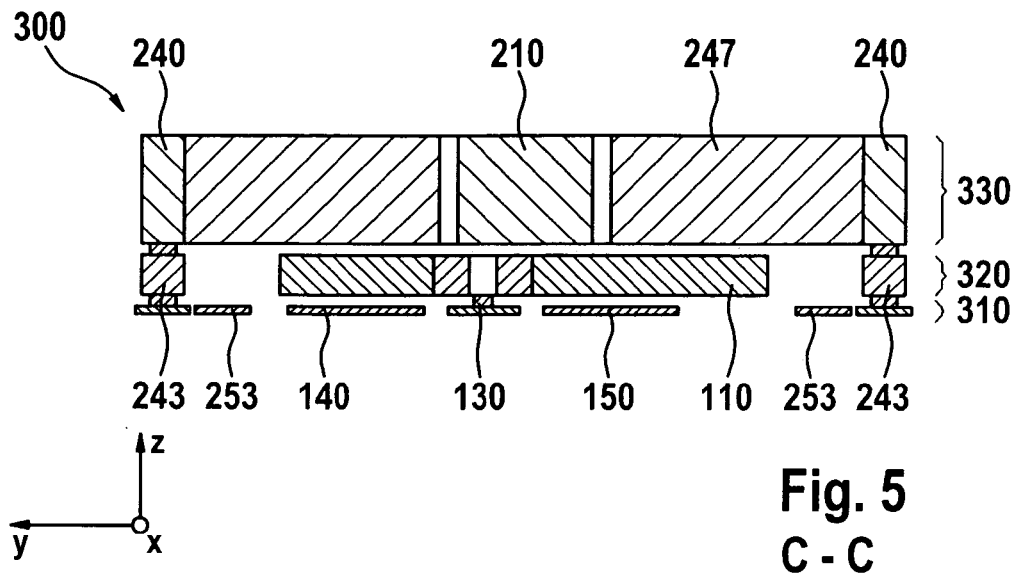
FIG. 5 shows a section through an x-z-sensor according to a first example embodiment.
Figure 6:
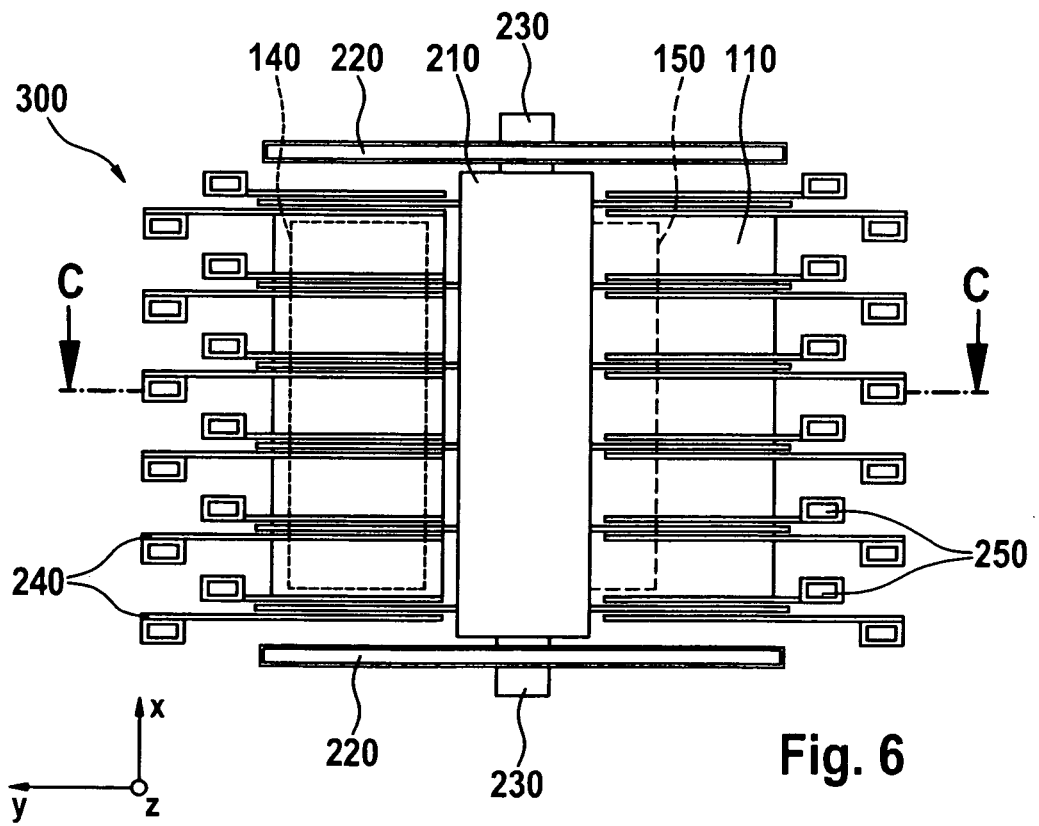
FIG. 6 shows a top view of the x-z-sensor.

FIG. 5 shows a section parallel to a y-z layer through an x-z-sensor 300 according to a first example embodiment. FIG. 6 shows a top view of x-z-sensor 300. x-z-sensor 300 is able to detect accelerations acting in the x-direction and also in the z-direction independent of one another and may be understood as a combination of z-sensor 100 and x-sensor 200 in FIGS. 1 to 4. FIG. 5 shows that x-z-sensor 300 has a total of three layers situated one above the other in the z-direction. Left conductor path electrode 140, right conductor path electrode 150, substrate connection 130 of z-sensor 100 and substrate connections 243, 253 of counter-electrodes 240 250 of x-sensor 200 are situated in a conductor path layer 310 rigidly connected to the substrate. A first function layer 320 in which rocker mass 110 of x-sensor 100 is situated lies a distance above conductor path layer 310 in the x-direction. Substrate connections 230, 243, 253 of x-sensor 200 are also situated in first function layer 320 in some sections. A second function layer 330 in which seismic mass 210 of x-sensor 200 and electrode fingers 247 and 257 of x-sensor 200 are situated lies a distance above first function layer 320 in the z-direction. The distances between layers 310, 320, 330 are such that rocker mass 110 of z-sensor 100 is able to tilt under the influence of an acceleration acting in the z-direction without coming in contact with layers 310, 330 above and below it.

Figure 7:
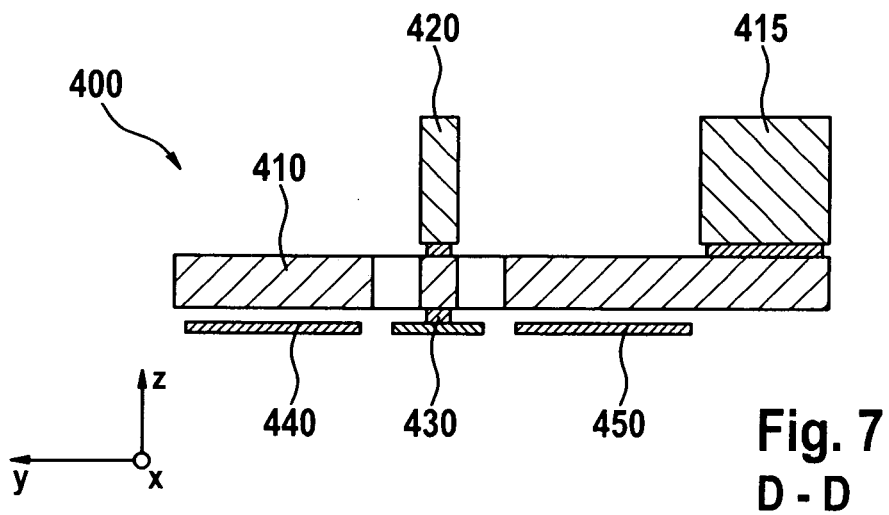
FIG. 7 shows a section through a second z-sensor.
Figure 8:
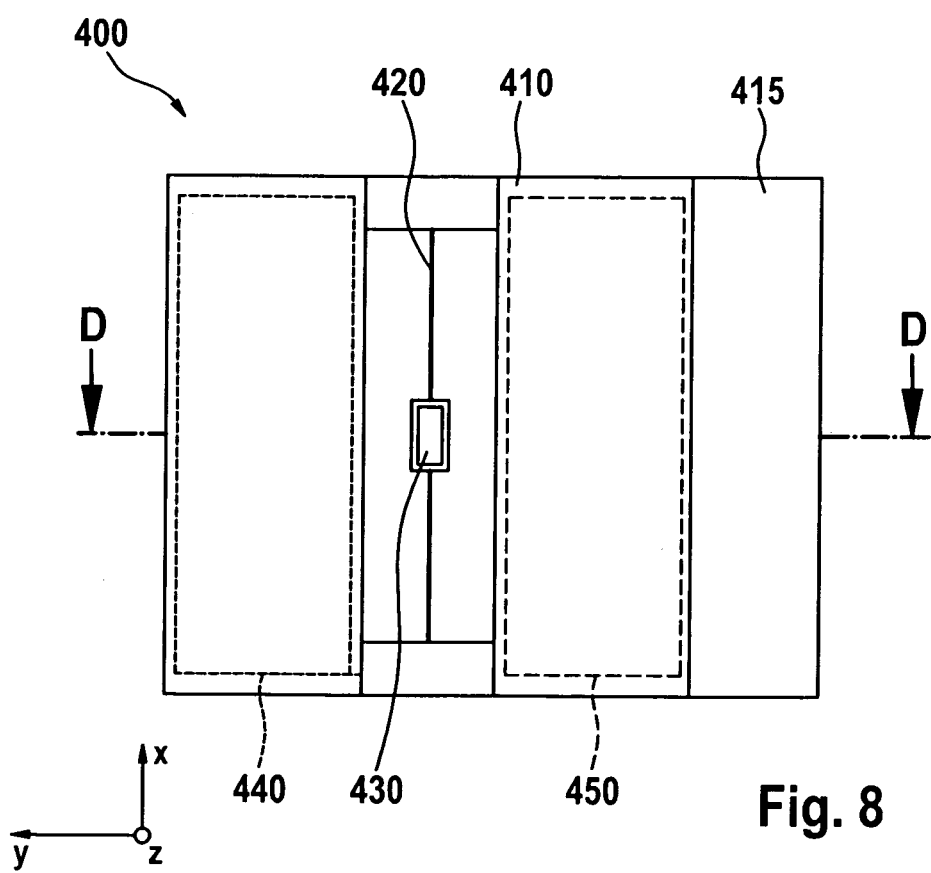
FIG. 8 shows a top view of the second z-sensor.

FIG. 7 shows a section parallel to a y-z layer through a second z-sensor 400. FIG. 8 shows a top view of second z-sensor 400. z-sensor 400 has a rocker mass 410, which is connected to a substrate (not shown in the figures) via a torsion spring 420 parallel to the x-direction and via a substrate connection 430. Rocker mass 410 has an extra mass 415 on one side with respect to torsion spring 420. FIG. 7 shows that torsion spring 420 and extra mass 415 protrude beyond the other sections of rocker mass 410 in the z-direction. A left conductor path electrode 440 and a right conductor path electrode 450 are situated beneath rocker mass 410 in the z-direction. An acceleration acting on z-sensor 400 in the z-direction causes rocker mass 410 to tilt about the axis of rotation formed by torsion spring 420 due to extra mass 415, thereby altering the capacitance of capacitors formed by rocker mass 410 and conductor path electrodes 440, 450, which is detectable by an electronic evaluation unit. The functioning of second z-sensor 400 corresponds to that of first z-sensor 100 of FIGS. 1 and 2 in this regard.

Figure 9:
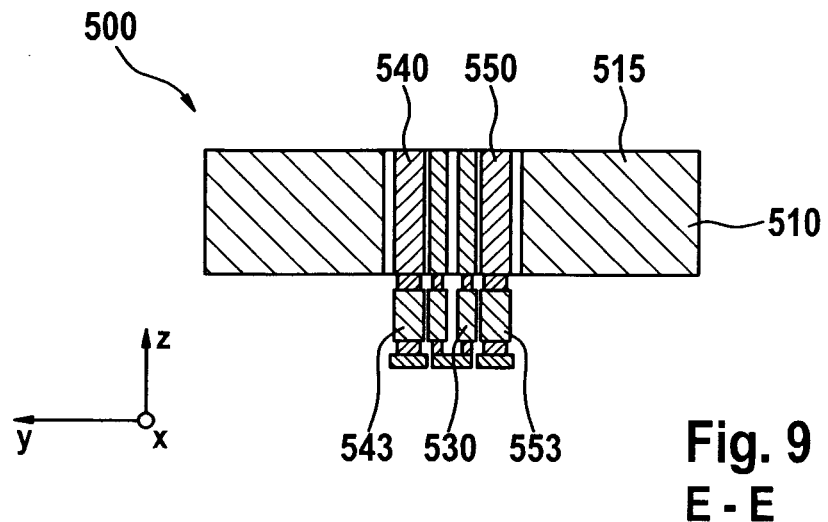
FIG. 9 shows a section through a second x-sensor.
Figure 10:
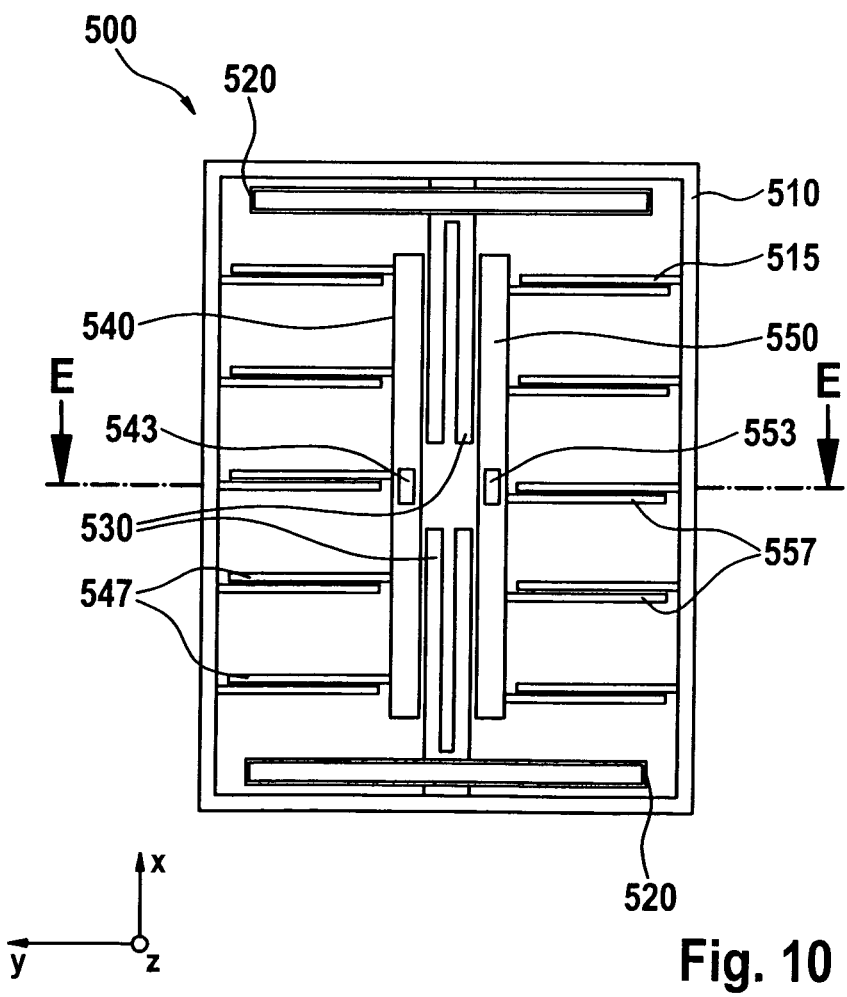
FIG. 10 shows a top view of the second x-sensor.

FIG. 9 shows a section parallel to a y-z layer through a second x-sensor 500. FIG. 10 shows a top view of second x-sensor 500; x-sensor 500 has a seismic mass 510, which is movably situated in the z-direction above a substrate (not shown in the figures). Seismic mass 510 is embodied as a frame in the x-y layer. Seismic mass 510 is connected to substrate connections 530 via two spiral springs 520 in the area bordered by the frame of seismic mass 510, establishing a connection to the substrate underneath and also functioning as feeder lines. Furthermore, the frame of seismic mass 510 has a plurality of mass fingers 515 pointing into the interior area of the frame of seismic mass 510 parallel to the y-direction. A first counter-electrode 540 and a second counter-electrode 550 are also situated in the internal area. Each counter-electrode 540, 550 is connected to the substrate via a substrate connection 543, 553, which also functions as an electrical feeder line. Furthermore, counter-electrodes 540, 550 have electrode fingers 547, 557 running in the y-direction, forming two capacitors together with mass fingers 515 of seismic mass 510. The distances between mass fingers 515 and electrode fingers 547, 557 change in opposite directions due to the deflection of seismic mass 510, resulting in a change in the capacitance of the capacitors, which is detectable by an electronic evaluation unit. To this extent, the functioning of second x-sensor 500 corresponds to that of first x-sensor 200 in FIGS. 3 and 4.

Figure 11:
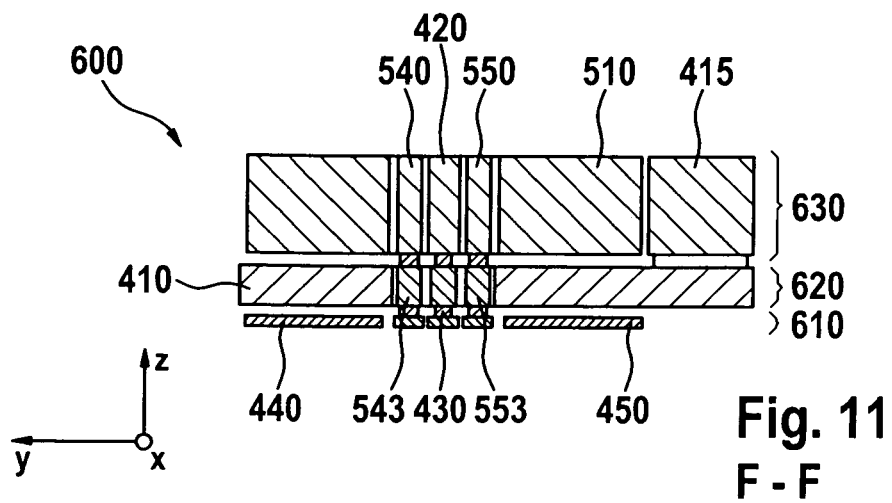
FIG. 11 shows a section through the x-z-sensor according to a second example embodiment.
Figure 12:
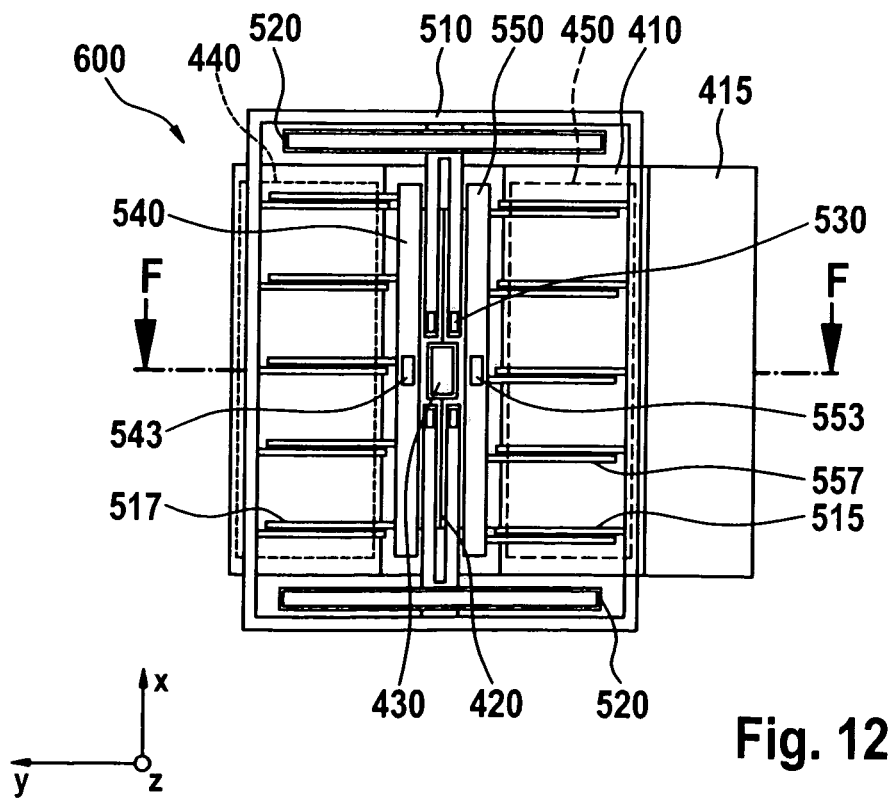
FIG. 12 shows a top view of the x-z-sensor of the second example embodiment.

FIG. 11 shows a section parallel to a y-z layer through an x-z-sensor 600 according to a second example embodiment. FIG. 12 shows a top view of x-z-sensor 600. x-z-sensor 600 includes z-sensor 400 from FIGS. 7 and 8 and x-sensor 500 from FIGS. 9 and 10 situated one above the other in the z-direction. FIG. 11 shows that x-z-sensor 600 has a conductor path layer 610, a first function layer 620 and a second function layer 630 situated one above the other and spaced a distance apart in the z-direction. Left conductor path electrode 440, right conductor path electrode 450 and substrate connection 430 of z-sensor 400 are situated in conductor path layer 610, where they are fixedly connected to the substrate. Furthermore, first substrate connection 543 of first counter-electrode 540, second substrate connection 553 of second counter-electrode 550 and substrate connection 530 of x-sensor 500 in conductor path layer 610 are connected to the substrate. Rocker mass 410 of z-sensor 400 is situated in first function layer 620. First substrate connection 543 of first counter-electrode 540 and second substrate connection 553 of second counter-electrode 550 of x-sensor 500 run through a recess in rocker mass 410 provided close to substrate connection 430 and torsion spring 420 of z-sensor 400. Seismic mass 510 of x-sensor 500, first counter-electrode 540 with its first electrode fingers 547 and second counter-electrode 550 with its second electrode fingers 557 are in second function layer 630. Furthermore, torsion spring 420 and extra mass 415 of z-sensor 400 are in second function layer 630. Torsion spring 420 and extra mass 415 are a distance away from seismic mass 510 and counter-electrodes 540, 550. Both component sensors of x-z-sensor 600 are thus situated partially one above the other in the z-direction, partially nested in one another. Parts of z-sensor 400 and parts of x-sensor 500 are situated in second function layer 630. The nested configuration of x-z-sensor 600 has the advantage that the available three-dimensional space is optimally utilized.

Figure 13:
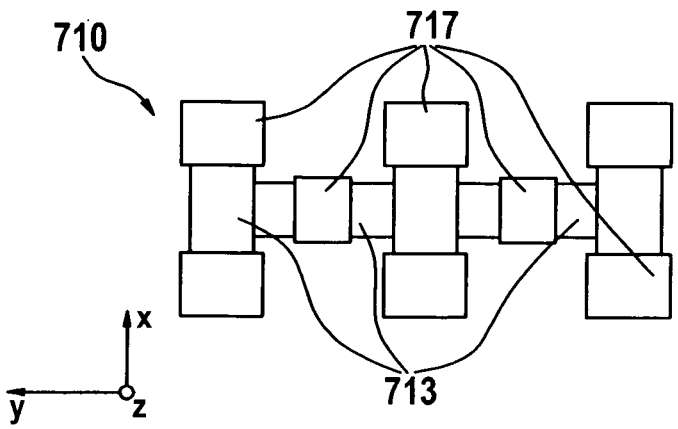
FIG. 13 shows a top view of a first movable element of a nested sensor structure according to a third example embodiment.
Figure 14:
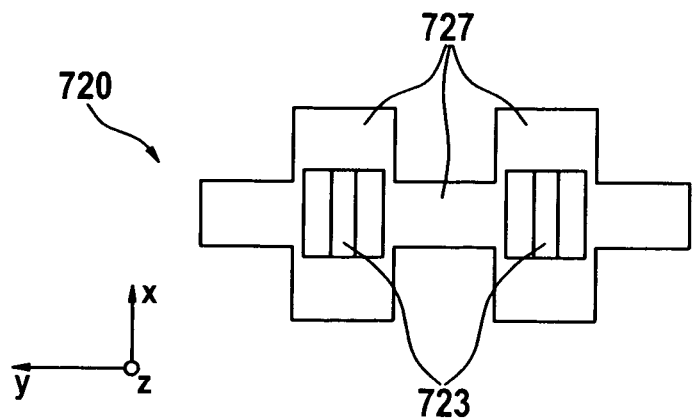
FIG. 14 shows a top view of a second movable element of the nested sensor structure according to the third example embodiment.
Figure 15:
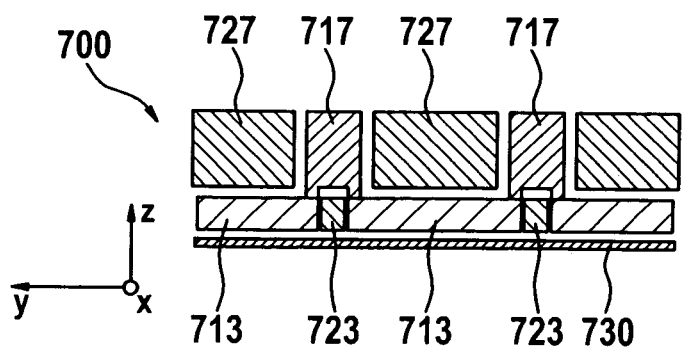
FIG. 15 shows a section through the nested sensor structure of the third example embodiment.
Figure 16:
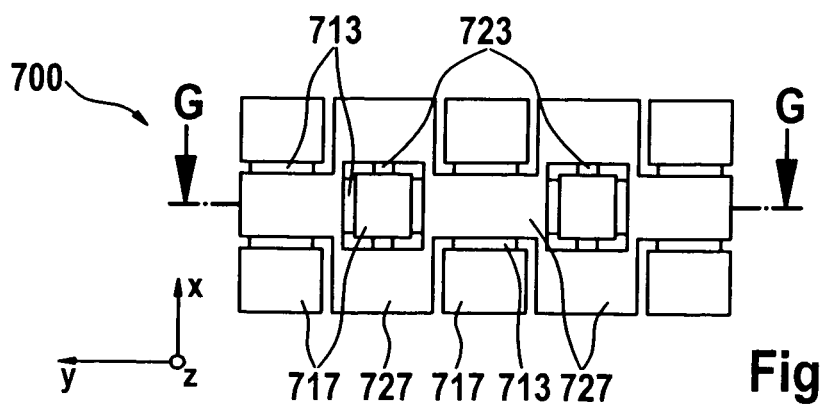
FIG. 16 shows a top view of the nested sensor structure of the third example embodiment.

The component sensors of a multichannel sensor structure may also be nested together more strongly. FIGS. 15 and 16 show a section through a top view of a nested sensor structure 700, which is situated above a substrate 730. Nested sensor structure 700 includes a first movable element 710, which is shown in a top view in FIG. 13 and a second movable element 720, which is shown in a top view in FIG. 14. A diagram of movable elements 710, 720 having spring elements connecting to substrate 730 has been omitted from FIGS. 13 to 16 for the sake of simplicity. First movable element 710 and second movable element 720 may both be deflectable in a z-direction perpendicular to the surface of substrate 730, for example. Nested sensor structure 700 may then have two z-channels for detection of accelerations in the z-direction. Using two separate channels may increase the accuracy of the acceleration measurement. First movable element 710 has first lower mass sections 713 and first upper mass sections 717. Second movable element 720 has second lower mass sections 723 and second upper mass sections 727. Lower and upper mass sections 713, 717 of first movable element 710 are designed to be complementary to lower and upper mass sections 723, 727 of second movable element 720. Therefore, first movable element 710 and second movable element 720 may be nested together, so that lower mass sections 713 of first movable element 710 and lower mass sections 723 of second movable element 720 are situated in a shared lower layer in the z-direction, and upper mass sections 727 of second movable element 720 are situated in a shared upper layer in the z-direction. The upper and lower layers are spaced a distance apart from one another. The individual mass sections are connected over the distance between the layers, which are spaced a distance apart in the z-direction, in the transitional areas between lower and upper mass sections 713, 717, 723, 727 of movable elements 710, 720.

x-z-sensor 300 of FIGS. 5 and 6, x-z-sensor 600 of FIGS. 11 and 12, and nested sensor structure 700 of FIGS. 13 through 16 each have a conductor path layer 310, 610, a first function layer 320, 620, and a second function layer 330, 630, perpendicular to the surface of a substrate one above the other in the z-direction. The underlying idea of providing movable elements of individual sensor cores in different conductive layers one above the other in the z-direction and nesting them one inside the other may also be applied to a system having a larger number of conductive layers and more than two sensor cores. On the basis of FIGS. 17 through 28, a method via which such a micromechanical system may be manufactured is explained below.

Figure 17:
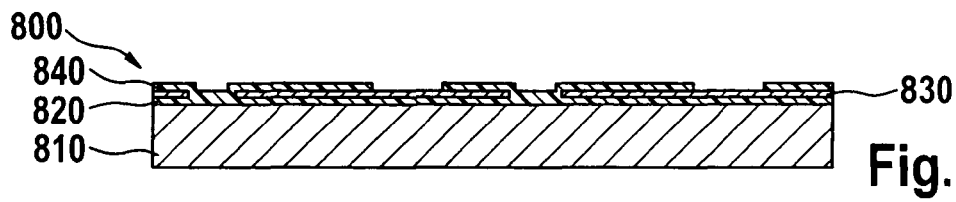
FIGS. 17 through 28 show fabrication steps in manufacturing a layered structure.
Figure 18:
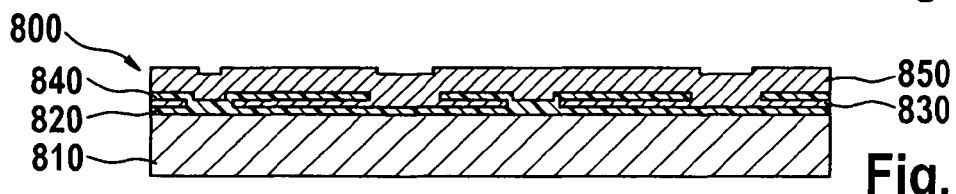

The fabrication begins with a substrate 810, which may be a silicon wafer, for example. A first insulation layer 820 is deposited on a surface of substrate 810. First insulation layer 820 may be made of a silicon oxide, for example. A first conductive layer 830 made of polycrystalline silicon, for example, is deposited on first insulation layer 820. Conductor paths, for example, and electrodes fixedly connected to substrate 810 may be created in first conductive layer 830. First conductive layer 830 then corresponds to conductor path layers 310, 610 of FIGS. 5 and 11. First conductive layer 830 is thus structured according to its use, which may be accomplished, for example, by etching methods, such as reactive ionic etching. A second insulation layer 840 is next deposited and also structured. Second insulation layer 840 may also be structured by suitable etching methods. FIG. 17 shows a schematic diagram of layer structure 800 which is then formed.

Figure 19:
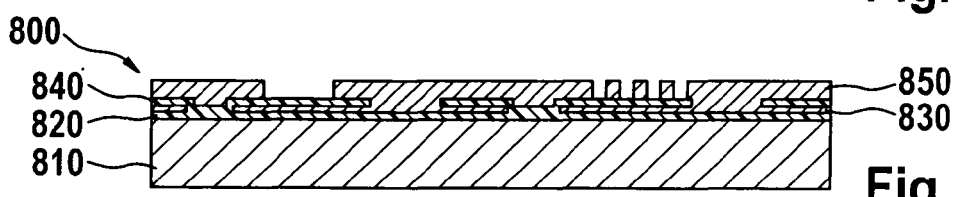

In the next fabrication step, a second conductive layer 850 is deposited (FIG. 18) and planarized, if necessary, by chemo-mechanical methods, for example. Second conductive layer 850 corresponds to first function layers 320, 620 of FIGS. 5 and 11. Conductive mechanical bonds between first conductive layer 830 and second conductive layer 850 are formed wherever this insulation layer 840 has been removed in the structuring of previously applied second insulation layer 840. Conductive substrate connection 130 of x-z-sensor 300 of FIGS. 5 and 6 may be created in this way, for example. Second conductive layer 850 is structured next. Movable elements and other parts of one or more micromechanical sensor structures may be created in second conductive layer 850. FIG. 19 illustrates the fabrication status at this point.

Figure 20:
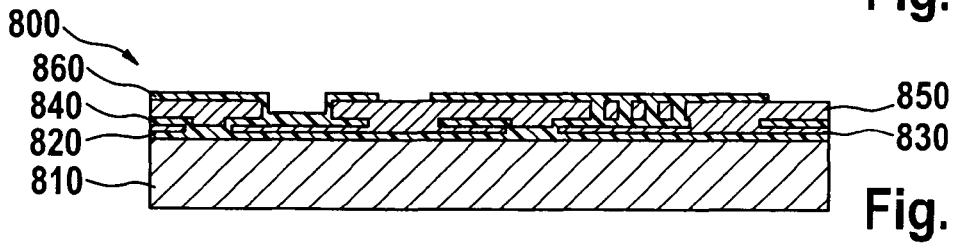
Figure 21:
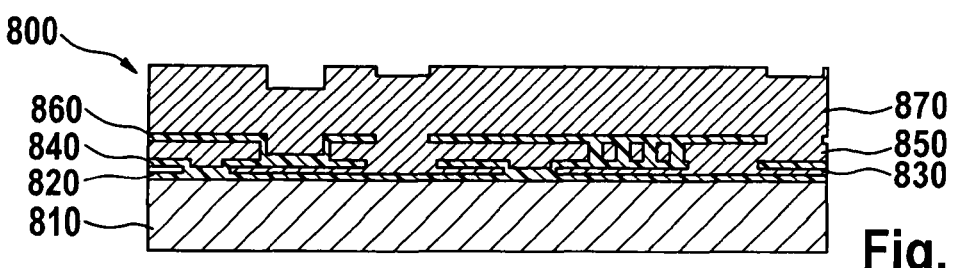
Figure 22:
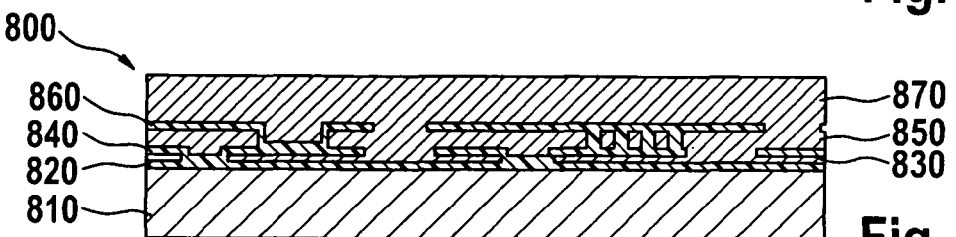

A third insulation layer 860 is subsequently deposited and structured. The etching trenches created during the structuring of second conductive layer 850 should be filled as completely as possible by depositing third insulation layer 860. A polishing step may be inserted before structuring third insulation layer 860, if necessary. FIG. 20 shows the present operating status.

Figure 23:
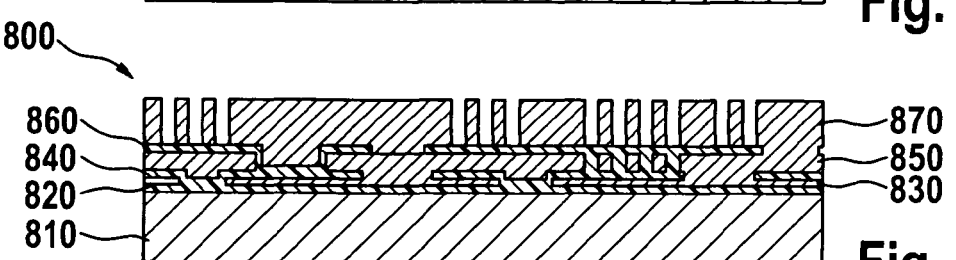

A third conductive layer 870 is deposited next (FIG. 21), forming a second micromechanical function layer and thus corresponding to second function layers 330, 630 of FIGS. 5 and 11. After an optional planarization of third conductive layer 870 (FIG. 22), conductive layer 870 is again structured by suitable methods (FIG. 23). Movable elements, springs and counter-electrodes provided in this function layer are thereby created.

Figure 24:
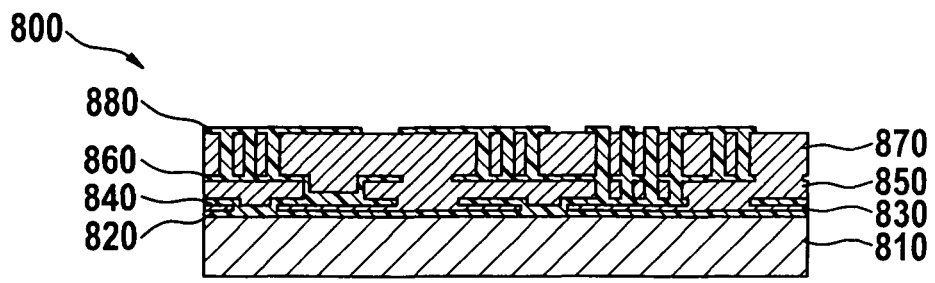

A fourth insulation layer 880 is now applied and structured next. Filling the etching trenches in underlying third conductive layer 870 as completely as possible by depositing fourth insulation layer 880 is again advantageous. FIG. 24 shows the fabrication status at this point.

Figure 25:
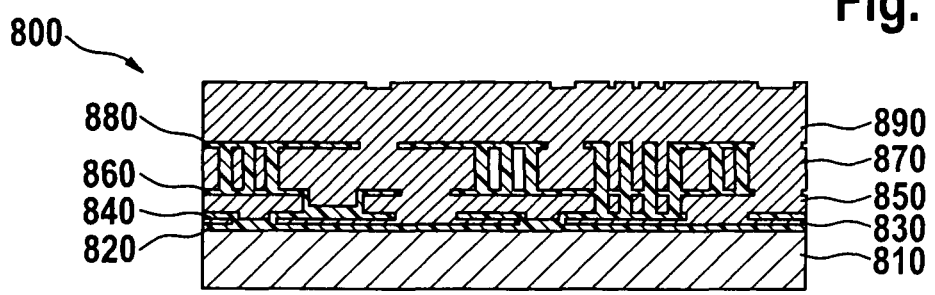
Figure 26:
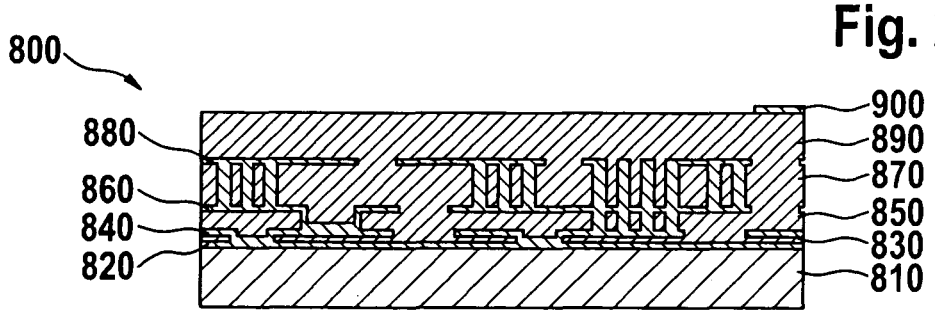
Figure 27:
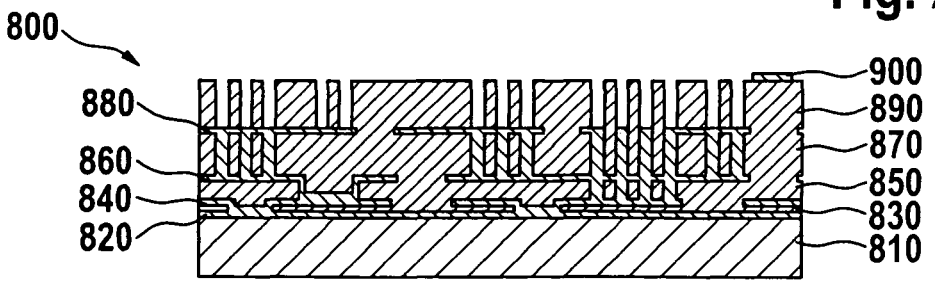

A fourth conductive layer 890 is applied next (FIG. 25). Fourth conductive layer 890 is a third micromechanical function layer in which parts of one or more micromechanical sensor structures may be created. After an optional planarization of fourth conductive layer 890, a metallization layer 900 may be applied and structured. Metallization layer 900 may also be structured using etching methods. This is illustrated in FIG. 26. Metallization layer 900 may be used for contacting the micromechanical systems created in layer structure 800. Fourth conductive layer 890 is next structured as desired. This is shown in FIG. 27.

Figure 28:
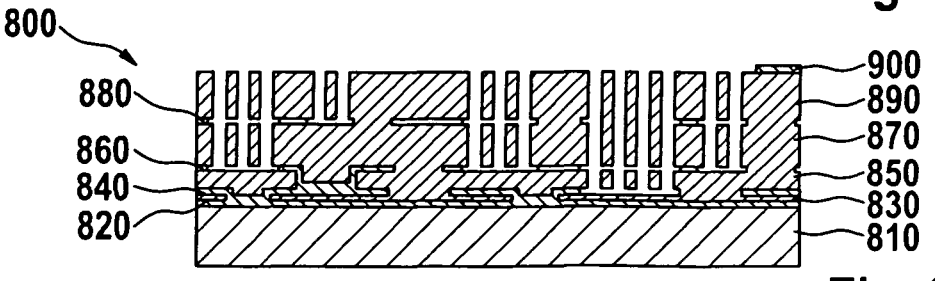

Parts of second insulation layer 840, third insulation layer 860, and fourth layer 880 are removed next. Insulation layers 840, 860, 880 may be removed using a suitable etching method, for example, by a sacrificial layer process using gaseous hydrofluoric acid. Micromechanical components created in second conductive layer 850, third conductive layer 870, and fourth conductive layer 890 may be exposed by removing parts of insulation layers 840, 860, 880. FIG. 28 shows finished processed layer structure 800.

After deposition of conductive layers 830, 850, 870, 890, additional method steps may be performed for doping conductive layers 830, 850, 870, 890, if necessary. The method explained on the basis of FIGS. 17 through 28 may also be combined with other known method steps. For example, partial areas of insulation layers 820, 840, 860, 880 may have a reduced layer thickness, so that a nubby structure is formed in conductive layer 830, 850, 870, 890 above it in these partial areas, resulting in an advantageous reduction in adhesive forces or in an increase in mechanical robustness. It is also possible to combine the method explained here with a method for substrate through-contacting and for thin-layer capping. In this case, the conductor path layer formed by first conductive layer 830 may be omitted. The method described here may also be expanded in a trivial manner for manufacturing a layered structure having additional insulation layers and conductive layers.

Second, third and fourth conductive layers 850, 870, 890 may also be structured largely independent of one another, so that any micromechanical elements may be situated in the individual layers and nested with one another. In areas where insulation layers 840, 860, 880 situated between two conductive layers are removed during the structuring of insulation layers 840, 860, 880, neighboring conductive layers 830, 850, 870, 890 are joined together. It is therefore possible to bridge and/or tunnel beneath multiple micromechanical elements created in conductive layers 850, 870, 890. This opens a great degree of freedom in the mechanical and electrical joining of the resulting micromechanical structures. In particular, a three-channel acceleration sensor having three independently movable partially nested movable elements situated partially one above the other in the z-direction may be created in layer structure 800 having four conductive layers 830, 850, 870, 890, as shown in FIG. 28.

Figure 29:
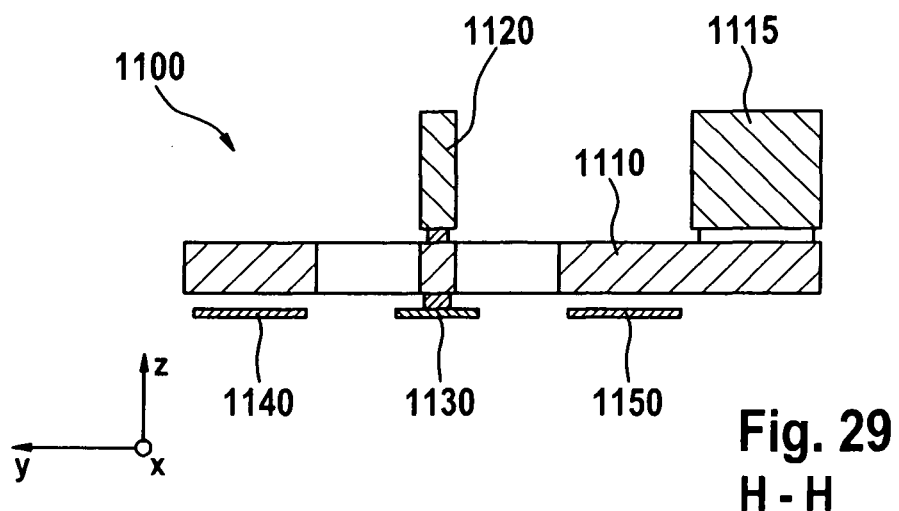
FIG. 29 shows a section through a third z-sensor.
Figure 30:
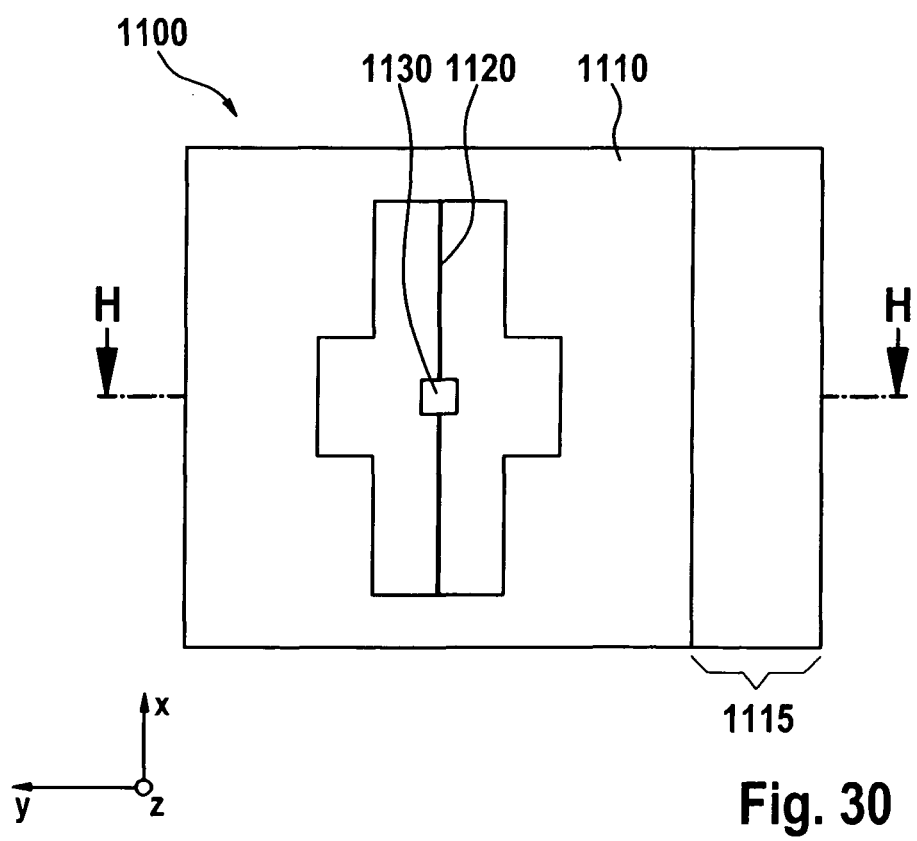
FIG. 30 shows a top view of the third z-sensor.

FIG. 29 shows a section through a third z-sensor 1100. FIG. 30 shows a top view of third z-sensor 1100. The structure of third z-sensor 1100 corresponds to that of second z-sensor 400 in FIGS. 7 and 8. z-sensor 1100 is provided for detection of accelerations acting in the z-direction. z-sensor 1100 includes a rocker mass 1110, which is connected to a substrate connection 1130 via a torsion spring 1120, this substrate connection in turn being rigidly connected to a substrate (not shown) and also functioning as an electrical feeder line. Rocker mass 1110 is designed to be asymmetrical with respect to torsion spring 1120 and has an extra mass 1115 on one side of torsion spring 1120. A left conductor path electrode 1140 and a right conductor path electrode 1150 are situated beneath rocker mass 1110 in the z-direction and are fixedly connected to the substrate. A tilting of rocker mass 1110, caused by an acceleration acting in the z-direction, about an axis of rotation formed by torsion spring 1120 changes the capacitances of the capacitors formed by left conductor path electrode 1140 and rocker mass 1110 and/or right conductor path electrode 1150 and rocker mass 1110. The change in capacitance is a measure of the magnitude of the acceleration and is detectable by an evaluation circuit. FIG. 29 shows that extra mass 1115 is situated above the other parts of rocker mass 1110 in the z-direction. Torsion spring 1120 and substrate connection 1130 also protrude beyond rocker mass 1110 in the z-direction.

Figure 31:
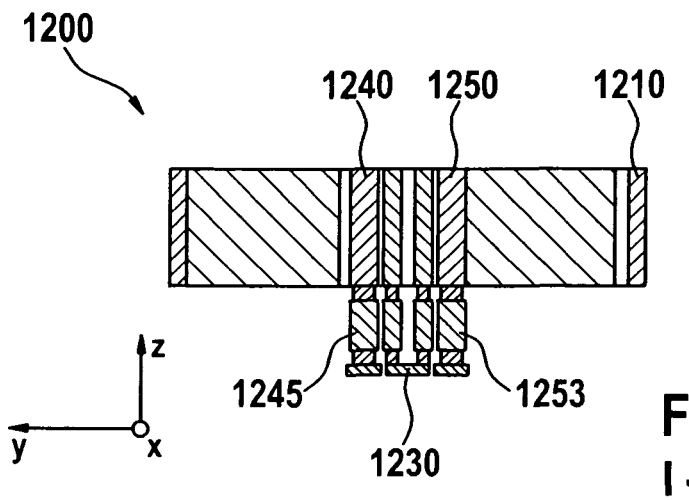
FIG. 31 shows a section through a third x-sensor.
Figure 32:
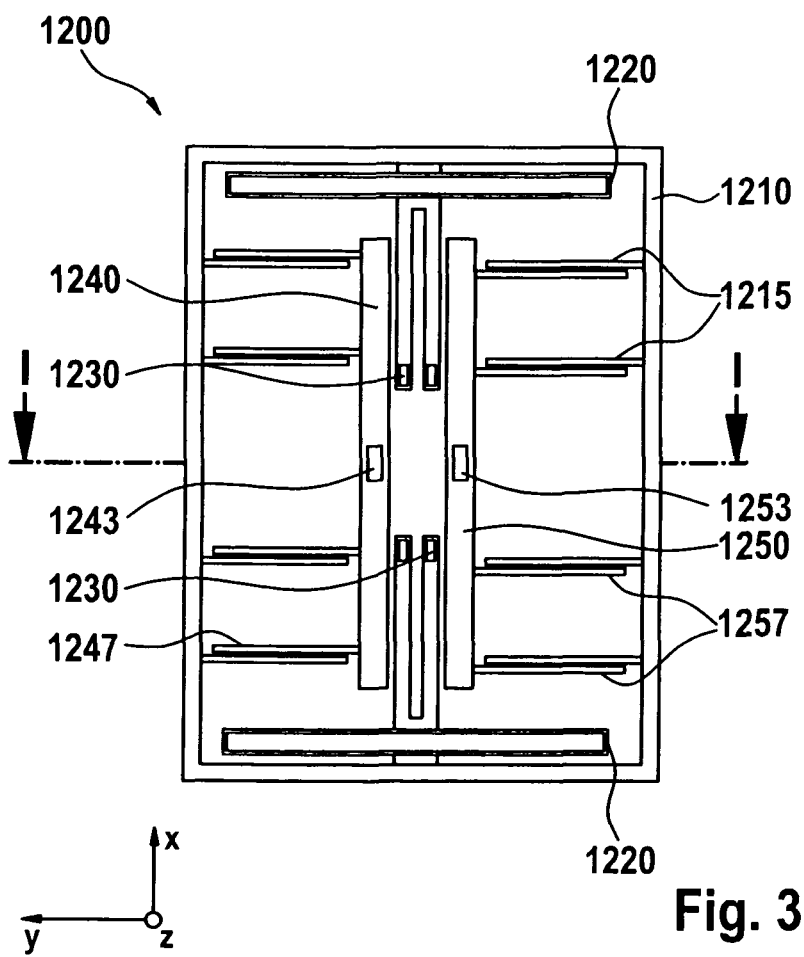
FIG. 32 shows a top view of the third x-sensor.

FIG. 31 shows a section through a third x-sensor 1200. FIG. 32 shows a top view of the third x-sensor 1200. The structure of third x-sensor 1200 corresponds to that of second x-sensor 500 of FIGS. 9 and 10. x-sensor 1200 has a seismic mass 1210 having mass fingers 1215 running in the y-direction. Seismic mass 1210 is connected to two substrate connections 1230 via two spiral springs 1220, establishing a connection to the substrate situated beneath seismic mass 1210 in the z-direction. A first counter-electrode 1240 is connected to the substrate via a first substrate connection 1243 and has first electrode fingers 1247, running parallel to some of mass fingers 1215. A second counter-electrode 1250 is connected to the substrate via a second substrate connection 1253 and has second electrode fingers 1257 running parallel to remaining mass fingers 1215 of seismic mass 1210. An acceleration acting on x-sensor 1200 in the x-direction results in a deflection of seismic mass 1210 in the x-direction, so distances between mass fingers 1250 and first electrode fingers 1247 and/or second electrode fingers 1257 are modified. The capacitors formed by first electrode fingers 1247 and mass fingers 1215 and/or second electrode fingers 1257 and mass fingers 1215 therefore undergo changes in capacitance, which are a measure of the magnitude of the acting acceleration and are detectable by an evaluation circuit.

Figure 33:
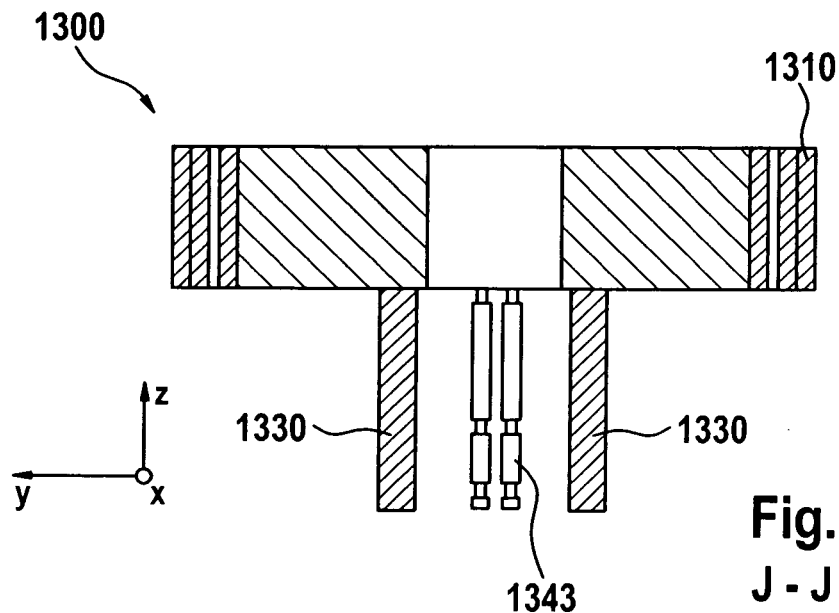
FIG. 33 shows a section through a y-sensor.
Figure 34:
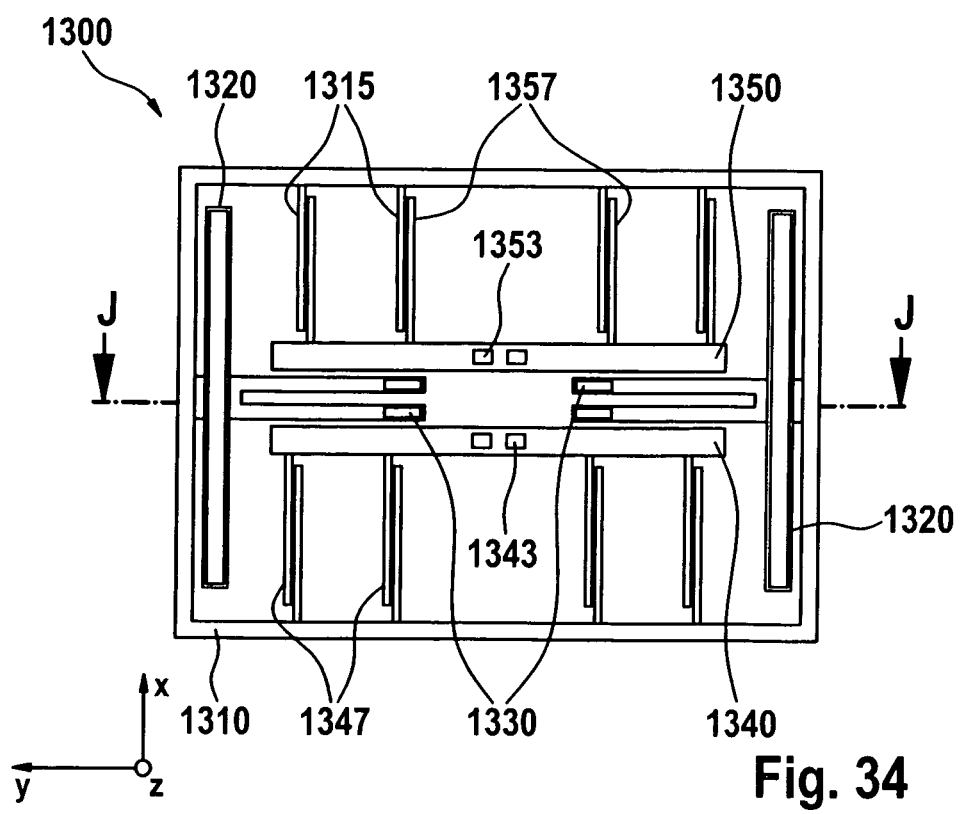
FIG. 34 shows a top view of the y-sensor.

FIG. 33 shows a section through a y-sensor 1300. FIG. 34 shows a top view of y-sensor 1300. y-sensor 1300 is provided for detection of accelerations acting in the y-direction and corresponds in its structure to x-sensor 1200 of FIGS. 31 and 32, where the sensor has been rotated about the z-axis by an angle of 90°. y-sensor 1300 thus has a seismic mass 1310, which is connected via two spiral springs 1320 to substrate connections 1330, which are rigidly connected to the substrate. Seismic mass 1310 may be deflected in the y-direction in relation to spiral springs 1320. Seismic mass 1310 has a plurality of mass fingers 1315. A first counter-electrode 1340 is connected to the underlying substrate via a substrate connection 1343. First counter-electrode 1340 has a plurality of first electrode fingers 1347 running parallel to mass fingers 1350 on one side of seismic mass 1310. A second counter-electrode 1350 is connected to the underlying substrate via a second substrate connection 1353. Second electrode fingers 1357 of second counter-electrode 1350 run parallel to mass fingers 1315 on the other side of seismic mass 1310. First electrode fingers 1357 and mass fingers 1315 form a first capacitor having a first capacitance. Second electrode fingers 1357 and mass fingers 1315 form a second capacitor having a second capacitance. The distances between mass fingers 1315 and electrode fingers 1347, 1357 change due to deflection of seismic mass 1310, so the capacitances of the capacitors change. These changes in capacitance are in turn detectable by an evaluation, circuit. In contrast with x-sensor 1200, substrate connections 1330, 1343, 1353 of y-sensor 1300 are lengthened in the z-direction, as shown in FIG. 33. Seismic mass 1310 is thus situated further above the substrate in the z-direction than seismic mass 1210 of x-sensor 1200.

Figure 35:
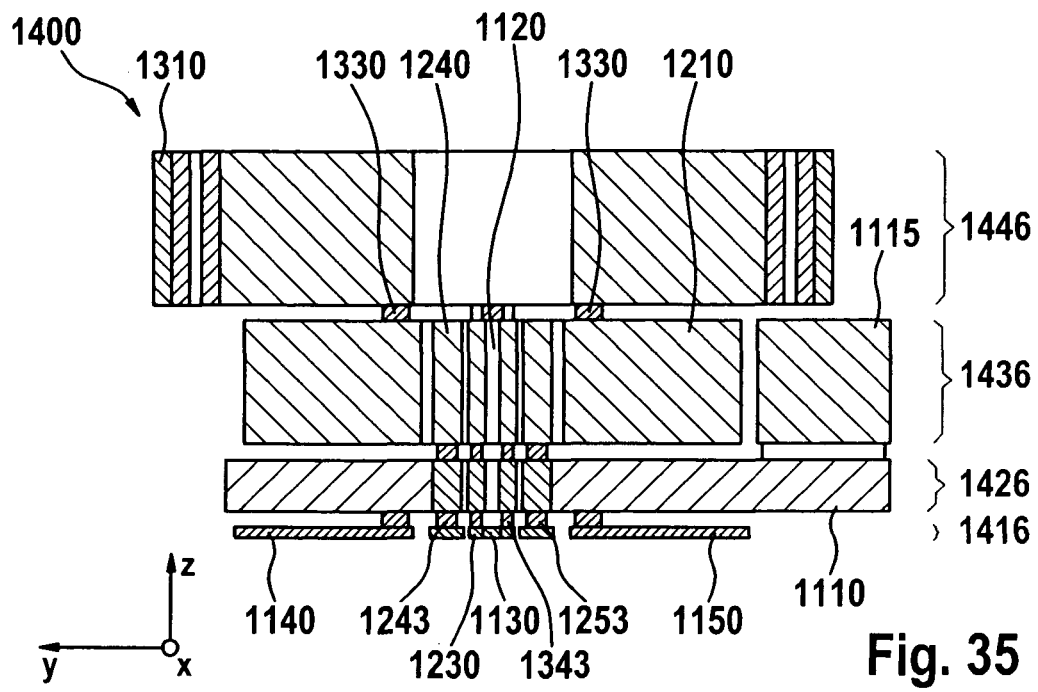
FIG. 35 shows a section through a three-channel sensor according to a fourth example embodiment.
Figure 36:
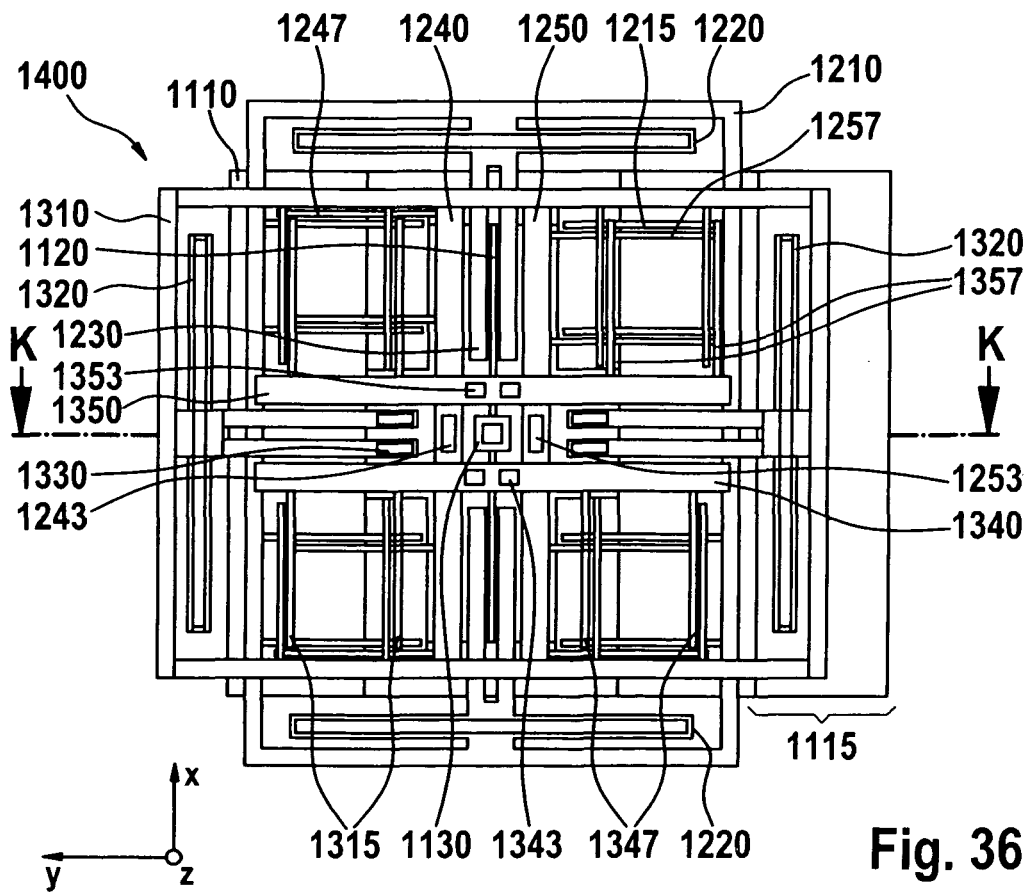
FIG. 36 shows a top view of the three-channel sensor of the fourth example embodiment.

FIG. 35 shows a section through an x-y-z-sensor 1400 according to a fourth example embodiment. FIG. 36 shows a top view of x-y-z-sensor 1400. x-y-z-sensor 1400 has three independent sensor cores having three independently deflectable movable elements via which accelerations acting in the x-, y- and z-directions are detectable independent of one another. To this end, z-sensor 1100 from FIGS. 29 and 30, x-sensor 1200 from FIGS. 31 and 32, and y-sensor 1300 from FIGS. 33 and 34 are combined in x-y-z-sensor 1400; x-y-z-sensor 1400 includes a conductor path layer 1410, a first function layer 1420, a second function layer 1430, and a third function layer 1440 situated one above the other with a distance between them in the z-direction. Left conductor path electrode 1140 and right conductor path electrode 1150 of z-sensor 1100 are situated in conductor path layer 1410. Furthermore, substrate connection 1130 of z-sensor 1100, substrate connections 1230, 1234, 1253 of x-sensor 1200, and substrate connections 1330, 1343, 1353 of y-sensor 1300 are connected to the substrate in conductor path layer 1410. Rocker mass 1110 of z-sensor 1100 is situated in first function layer 1420. Substrate connections 1230, 1243, 1253 of x-sensor 1200 and substrate connections 1330 1343, 1353 of y-sensor 1300 run through a recess situated next to the torsion spring in rocker mass 1110 of z-sensor 1100. Extra mass 1115 of rocker mass 1110 of z-sensor 1100 is situated in second function layer 1430. Furthermore, seismic mass 1210 and electrode fingers 1247, 1257 of x-sensor 1200 are situated in second function layer 1430. Substrate connections 1330, 1343, 1353 of y-sensor 1300 run through a recess in seismic mass 1210 of x-sensor 1200 in second function layer 1430. Seismic mass 1310 and counter-electrodes 1340, 1350 of y-sensor 1300 are situated in third function layer 1440.

x-y-z-sensor 1400 may be manufactured using the method explained with reference to FIGS. 17 through 28. Conductor path layer 1410, first function layer 1420, second function layer 1430, and third function layer 1440 then correspond to conductive layers 830, 850, 870, 890. Layers 1410, 1420, 1430, 1440 are each spaced a distance apart from one another. These distances are formed by dissolving intermediate insulation layers 840, 860, 880. The distance between first function layer 1420 and second function layer 1430 is great enough to allow tilting of rocker mass 1110 of z-sensor 1100 about the axis of rotation formed by torsion spring 1120 without rocker mass 1110 coming into contact with seismic mass 1210 of x-sensor 1200 situated above it in the z-direction. Accordingly, the parts of z-sensor 1100 and of x-sensor 1200 situated in second function layer 1430 are spaced an adequate distance apart from one another. The overlapping configuration of z-sensor 1100, x-sensor 1200, and y-sensor 1300 in the z-direction yields an extremely compact design of x-y-z-sensor 1400.

What is claimed is:

1. A micromechanical sensor, comprising:
a substrate;
a first movable element connected to the substrate by a first spring element; and
a second movable element connected to the substrate by a second spring element;
wherein the first movable element and the second movable element are independently movable in relation to the substrate, and wherein the first movable element and the second movable element are situated one above the other perpendicular to the substrate surface in at least some sections;
wherein the first spring element is a torsional spring and the second spring element is a spiral spring.

2. The micromechanical system as recited in claim 1, wherein the first movable element and the second movable element are electrically insulated from one another.

3. The micromechanical system as recited in claim 2, further comprising:
a detection device configured to detect at least one of a deflection of the first movable element and a deflection of the second movable element in relation to the substrate.

4. The micromechanical system as recited in claim 3, wherein:
the first movable element has a first electrically conductive electrode;
the detection device includes a first fixed electrode connected rigidly to the substrate;
the second movable element has a second electrically conductive electrode; and
the detection device includes a second fixed electrode rigidly connected to the substrate.

5. The micromechanical system as recited in claim 3, further comprising:
a third movable element connected to the substrate by a third spring element, wherein the third movable element is movable in relation to the substrate independent of the first movable element and the second movable element, and wherein the second movable element and the third movable element are situated one above the other perpendicular to the substrate surface in at least some sections.

* * * * *